United States Patent
Huang et al.

(10) Patent No.: US 9,852,957 B2
(45) Date of Patent: Dec. 26, 2017

(54) TESTING, MANUFACTURING, AND PACKAGING METHODS FOR SEMICONDUCTOR DEVICES

(71) Applicant: Taiwan Semiconductor Manufacturing Company, Ltd., Hsin-Chu (TW)

(72) Inventors: Li-Hsien Huang, Zhubei (TW); Yung-Shou Cheng, Dou-liu (TW); Yan-Fu Lin, Zhubei (TW); An-Jhih Su, Bade (TW); Wei-Cheng Wu, Hsin-Chu (TW); Chin-Hsien Chen, New Taipei (TW); Hsien-Wei Chen, Hsin-Chu (TW); Der-Chyang Yeh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/167,256

(22) Filed: May 27, 2016

(65) Prior Publication Data
US 2017/0345726 A1 Nov. 30, 2017

(51) Int. Cl.
*H01L 21/00* (2006.01)
*H01L 21/66* (2006.01)
*H01L 21/768* (2006.01)
*H01L 21/78* (2006.01)

(52) U.S. Cl.
CPC ........ *H01L 22/14* (2013.01); *H01L 21/76802* (2013.01); *H01L 21/76879* (2013.01); *H01L 21/76883* (2013.01); *H01L 21/78* (2013.01); *H01L 22/32* (2013.01)

(58) Field of Classification Search
CPC ..................................................... H01L 22/14
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |

(Continued)

*Primary Examiner* — William Harriston
(74) *Attorney, Agent, or Firm* — Slater Matsil, LLP

(57) ABSTRACT

Methods of testing, manufacturing, and packaging semiconductor devices are disclosed. In some embodiments, a method of testing a semiconductor device includes providing an integrated circuit die having contacts disposed thereon, forming an insulating material over the integrated circuit die and the contacts, and forming an opening in the insulating material over the contacts. A eutectic material is formed in the openings over the contacts, and the integrated circuit die is electrically tested by contacting the eutectic material disposed over the contacts. The eutectic material is removed.

20 Claims, 22 Drawing Sheets

(56) References Cited

U.S. PATENT DOCUMENTS

| | | |
|---|---|---|
| 2013/0168848 A1 | 7/2013 | Lin et al. |
| 2013/0285056 A1* | 10/2013 | Pagani ................... H01L 22/14 |
| | | 257/48 |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

* cited by examiner

TESTING, MANUFACTURING, AND PACKAGING METHODS FOR SEMICONDUCTOR DEVICES

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packages for semiconductor devices that has been developed are wafer level packages (WLPs), in which integrated circuits are packaged in packages that typically include a redistribution layer (RDL) or post-passivation interconnect (PPI) that is used to fan-out wiring for contact pads of the package so that electrical contacts may be made on a larger pitch than contact pads of the integrated circuit. WLPs are often used to package integrated circuits (ICs) that demand high speed, high density, and greater pin count, as examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
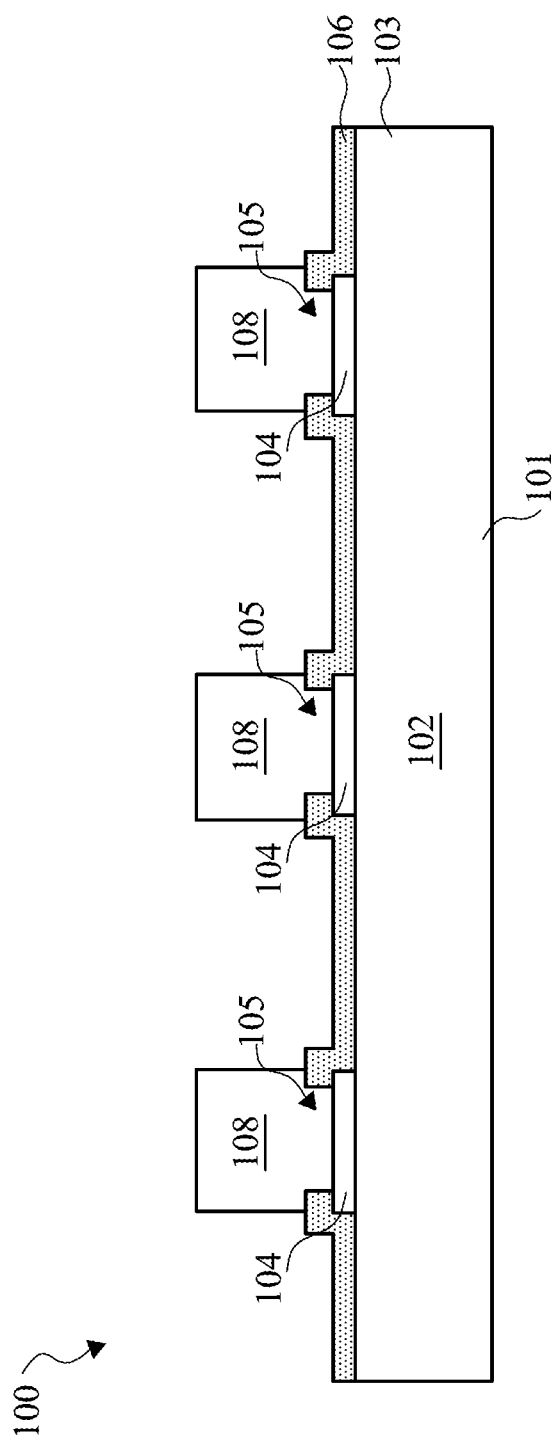
FIGS. 1 through 7 are cross-sectional views that illustrate a method of manufacturing and testing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of testing, manufacturing, and packaging semiconductor devices are disclosed in the present disclosure. A eutectic material is formed over contacts of integrated circuit dies, and the eutectic material is later removed. An insulating material is formed around and over the contacts of the integrated circuit dies before the eutectic material is formed. Openings are formed in the insulating material, and the eutectic material is applied through the openings. The openings in the insulating material have a width or diameter that is less than the width or diameter of the contacts in some embodiments. The contacts comprise conductive pillars in some embodiments. Forming the insulating material before forming the eutectic material provides advantages such as preventing a formation of an inter-metallic compound (IMC) and improving an adhesion quality between sidewalls of the contacts and the insulating material in some embodiments. Throughout the various views and illustrative embodiments, like reference numerals are used to designate like elements.

FIGS. 1 through 7 are cross-sectional views that illustrate a method of manufacturing and testing a semiconductor device 100 at various stages in accordance with some embodiments of the present disclosure. Referring first to FIG. 1, in some embodiments, an integrated circuit die 102 is provided. The integrated circuit die 102 includes a substrate 101 that may comprise a wafer, for example. The substrate 101 may comprise a semiconductor substrate, such as a silicon substrate, a silicon carbon substrate, a silicon germanium substrate, or a substrate formed of other semiconductor materials, as examples. The substrate 101 of the integrated circuit die 102 may comprise a bulk substrate, a semiconductor-on-insulator (SOI) substrate, or other acceptable types of substrates. The substrate 101 may be lightly doped with a p-type or an n-type impurity. The substrate 101 may comprise a silicon wafer or a wafer comprised of another type of semiconductor material in some embodiments.

The substrate 101 may comprise a plurality of integrated circuit die 102 regions that are separated from one another by portions of the substrate 101 that may comprise singulation regions or scribe lines 126 (see FIG. 7) in some embodiments, for example. The integrated circuit die 102 regions may comprise a square, rectangular, or other shapes in a top view of the substrate 101, for example. The integrated circuit die 102 regions may be formed on the substrate 101 in an array of rows and columns. Dozens or hundreds of integrated circuit die 102 regions may be defined on a substrate 101, for example. Other numbers of integrated circuit die 102 regions may be defined on the substrate 101 in other arrangements or configurations.

Active circuitry may be formed in active circuit regions of the integrated circuit die 102 regions. The active circuitry is formed within or over the substrate 101 in the active circuit regions, for example. The active circuitry in the active circuit regions may be disposed in an upper portion of the substrate 101 in the view shown in FIG. 1, for example. The active circuitry formed in the integrated circuit die 102 regions of the substrate 101 may comprise any type of circuitry suitable for a particular application. The active circuitry may comprise one or more logic, memory, processor, or other type of devices, as examples. As other examples, the active circuitry formed within or on the active circuit regions of the substrate 101 may include various N-type metal-oxide semiconductor (NMOS) and/or P-type metal-oxide semiconductor (PMOS) devices, such as transistors, capacitors, resistors, diodes, photo-diodes, fuses, and the like, that are interconnected to perform one or more functions. The functions may include memory structures, logic structures, processing structures, sensors, amplifiers, power distribution, input/output circuitry, and/or the like. One of ordinary skill in the art will appreciate that the above examples are provided for illustrative purposes to further explain applications of some illustrative embodiments and are not meant to limit the disclosure in any manner. Other active circuitry may be used as appropriate for a given application. The active circuit regions may comprise a depth within a surface of the substrate 101 comprising about one-half the thickness of the substrate 101 or less in some embodiments, for example.

In some embodiments, an interconnect structure 103 is formed over the substrate 101 over the active circuit regions. The interconnect structure 103 is formed in a back-end-of-line (BEOL) process, and the active circuitry in the active circuit region of the substrate 101 comprises circuitry formed in a front-end-of-line (FEOL) process in some embodiments, for example. The interconnect structure 103 comprises a plurality of conductive features disposed within a plurality of insulating materials. The interconnect structure 103 may comprise a plurality of inter-layer dielectric (ILD) layers and/or a plurality of inter-metallization dielectric (IMD) layers. For example, the insulating materials may be formed of a low dielectric constant (K) insulating material, such as phosphosilicate glass (PSG), borophosphosilicate glass (BPSG), fluorosilicate glass (FSG), SiOxCy, spin-on-glass, spin-on-polymers, silicon carbon material, compounds thereof, composites thereof, combinations thereof, or the like, formed using any suitable methods known in the art, such as spinning, chemical vapor deposition (CVD), plasma-enhanced CVD (PECVD), and other methods.

The plurality of conductive features of the interconnect structure 103 interconnect various passive and active components (not shown) formed in and on the active circuit region of the substrate 101 to one another and to external components. The interconnect structure 103 may include, for instance, two or more layers of conductive traces vertically interconnected by vias (not shown) embedded within dielectric layers that are formed using damascene processes or subtractive etch techniques. Conductive features of the interconnect structure 103 may comprise conductive lines, vias, and/or plugs that comprise a conductive material such as copper, a copper alloy, or other metals. One, two, three, or more conductive feature layers may be included in the interconnect structure 103 of the semiconductor device 100.

Regardless of the number of layers of the interconnect structure 103, the semiconductor device 100 includes a plurality of contact pads 104 that are disposed over an uppermost interconnect layer of the interconnect structure 103, for example. The plurality of contact pads 104 make electrical connection with conductive features in the uppermost interconnect layer or layers of the interconnect structure 103. In some embodiments, the plurality of contact pads 104 may comprise aluminum, copper, other metals, or alloys, combinations, or multiple layers thereof, as examples. The plurality of contact pads 104 may also comprise other materials. The plurality of contact pads 104 may be formed on the integrated circuit die 102 using a subtractive etch process, a damascene process, or a plating process, as examples. The plurality of contact pads 104 may also comprise other materials and formation methods. The plurality of contact pads 104 may each comprise a shape in a top view of the semiconductor device 100 of a circle, oval, square, rectangle, or other shapes.

An insulating material 106 is disposed over the integrated circuit die 102 and over the plurality of contact pads 104 disposed over the integrated circuit die 102. The insulating material 106 is also referred to herein as a first insulating material 106. The first insulating material 106 comprises a passivation material layer in some embodiments. The first insulating material 106 comprises a polymer in some embodiments having a thickness of about 5 μm to about 20 μm or less, for example. The first insulating material 106 may comprise epoxy, polybenzoxazole (PBO), polyimide, benzocyclobutene (BCB), other insulating materials, or the like. The first insulating material may be formed by any acceptable deposition process, such as spin coating, CVD, laminating, the like, or a combination thereof. The first insulating material 106 deposition process may or may not include a curing step. The first insulating material 106 may also comprise other dimensions, materials, and formation methods.

An opening 105 is formed in the first insulating material 106 over each of the plurality of the contact pads 104, and contacts 108 are formed in the openings 105 of the first insulating material 106 over each of the plurality of contact pads 104, as shown in FIG. 1. The openings 105 are also referred to herein as first openings 105. The openings 105 are formed using a photolithography process in some embodiments. For example, a layer of photoresist (not shown) may be formed over the first insulating material 106, and the layer of photoresist is patterned. The layer of photoresist is exposed to energy or light reflected from or transmitted through a lithography mask, and the layer of photoresist is developed. Exposed (or unexposed, depending on whether the layer of photoresist comprises a positive or negative type of photoresist) regions of the layer of photoresist are removed. The layer of photoresist is used as an etch mask for an etch process for the first insulating material 106, forming the plurality of openings in the first insulating material 106. The layer of photoresist is then removed.

The first openings 105 have a width or diameter that is less than the width or diameter of each of the plurality of contact pads 104 in some embodiments. The width or diameter of the first openings 105 being less than the width or diameter of the plurality of contact pads 104 ensures coverage of the surface of the integrated circuit die 102 by the first insulating material 106 so that the first insulating material 106 provides passivation for the surface of the integrated circuit die 102 in some embodiments, for example. In some embodiments, the first openings 105 may have a width or diameter that is greater than or about the same as the width or diameter of each of the plurality of contact pads 104, not shown.

A plurality of contacts 108 is formed over the semiconductor device 100, which is shown in FIG. 1. One of the plurality of contacts 108 is formed over each of the plurality of contact pads 104 through the openings 105 in the first insulating material 106, which is also shown in FIG. 1. The plurality of contacts 108 comprise conductive pillars in some embodiments, and the plurality of contacts 108 are also referred to herein as conductive pillars or a plurality of conductive pillars. Each of the plurality of contacts 108 may be wider at the top than at the bottom in some embodiments, as illustrated in FIG. 1. In some embodiments, the plurality of contacts 108 may be wider at the bottom than at the top, the plurality of contacts 108 may comprise substantially straight sidewalls, or the plurality of contacts 108 may also comprise other shapes, not shown. The plurality of contacts 108 may each comprise a shape in a top view of the semiconductor device 100 of a circle, oval, square, rectangle, or other shapes. The plurality of contacts 108 may comprise each comprise a height of about 10 μm to about 30 μm and a width of about 35 μm to about 90 μm in some embodiments, as examples. The plurality of contacts 108 may also comprise other dimensions.

The plurality of contacts 108 may comprise copper, aluminum, other metals, or combinations or multiple layers thereof in some embodiments, for example. The plurality of contacts 108 may be formed using a plating process in some embodiments. For example, a seed layer (not shown) comprising copper or other metals may be formed over the first insulating material 106 and over exposed portions of the plurality of contact pads 104. A layer of photoresist (also not shown) may be formed over the seed layer, and the layer of photoresist is patterned using photolithography with a desired pattern for the plurality of contacts 108. A conductive material is then plated on through the patterns in the layer of photoresist over exposed portions of the seed layer, forming the plurality of contacts 108 which are comprised of the seed layer and the conductive material. The layer of photoresist is then removed, and exposed portions of the seed layer that were previously covered by the layer of photoresist are removed using an etch process.

Other methods may also be used to form the plurality of contacts 108, such as damascene processes and/or subtractive etch processes, as examples. In a subtractive etch process, for example, a layer of conductive material may be blanket deposited over the first insulating material 106 and over exposed portions of the plurality of contact pads 104. A layer of photoresist (not shown) may be formed over the layer of conductive material, and the layer of photoresist is patterned using photolithography with a desired pattern for the plurality of contacts 108, with openings in the layer of photoresist being formed in regions where the plurality of contacts 108 is not desired to be formed. Exposed portions of the layer of conductive material are then etched away using the layer of photoresist as an etch mask, forming the plurality of contacts 108 which are comprised of the portions of the layer of conductive material that are left remaining. The layer of photoresist is then removed.

In some embodiments of the present disclosure, an integrated circuit die 102 comprising the plurality of contacts 108 illustrated in FIG. 1 disposed thereon is provided, as another example. A substrate 101 comprising a wafer that is unsingulated may be provided that includes a plurality of the integrated circuit dies 102 disposed thereon, and each of the plurality of integrated circuit dies 102 on the wafer may include a plurality of contacts 108 comprising conductive pillars disposed thereon.

Figure 2:
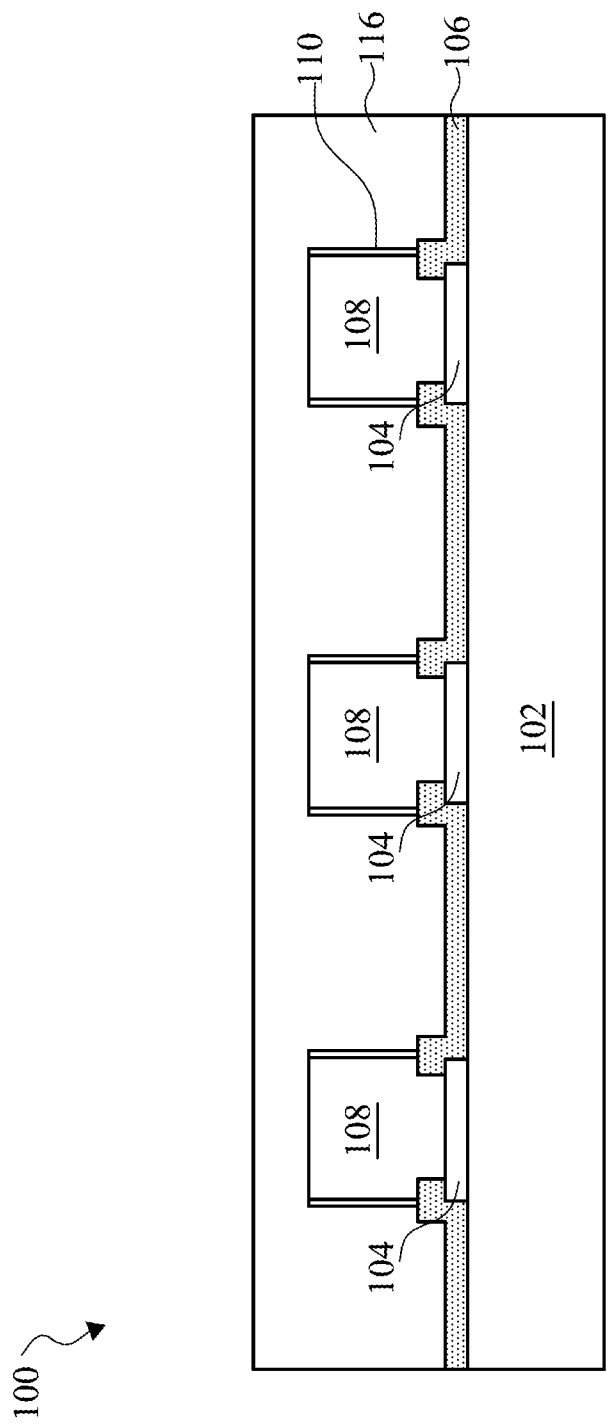

Next, an insulating material 116 is formed over the integrated circuit die 102 and the plurality of contacts 108, as illustrated in the cross-sectional view shown in FIG. 2. The insulating material 116 is also referred to herein as a second insulating material 116. The second insulating material 116 may comprise a similar material and deposition method as described for the first insulating material 106 in some embodiments. The second insulating material 116 has a greater thickness than the first insulating material 106 in some embodiments, as illustrated in FIG. 2. The second insulating material 116 may also comprise a different material than the first insulating material 106 in some embodiments, or may be formed using different methods than were used to form the first insulating material 106.

The second insulating material 116 is deposited having a thickness such that the second insulating material 116 extends over top surfaces of the plurality of contacts 108 in some embodiments, as illustrated in the cross-sectional view of the semiconductor device 100 shown FIG. 2. The second insulating material 116 may extend above a top surface of the plurality of contacts 108 by about 5 μm to about 10 μm in some embodiments, for example. The second insulating material 116 extends above the top surface of the plurality of contacts 108 by an amount sufficient to facilitate a subsequently formed eutectic material 120 (not shown in FIG. 2; see FIG. 4), for example. The second insulating material 116 may also extend above the top surface of the plurality of contacts 108 by other dimensions.

In some embodiments, the semiconductor device 100 is then heated to cure the second insulating material 116 as shown in FIG. 2. The semiconductor device 100 may be heated to an appropriate temperature to cure the second insulating material 116. In some embodiments, the semiconductor device 100 is heated to a temperature of about 200 degrees C. to about 350 degrees C. for about 1 to 2 hours in some embodiments, as examples. The second insulating material 116 may also be cured at other temperatures and using other time durations. The second insulating material 116 may also be cured using other methods. In some embodiments, the second insulating material 116 is cured as applied, and a curing step is not required.

The curing process for the second insulating material 116 may result in the formation of an inter-metallic compound (IMC) 110 on sidewalls of the plurality of contacts 108 in some embodiments. In some embodiments, an IMC 110 is not formed, because a eutectic material 120 (not shown in FIG. 2; see FIG. 4) has not been formed over the plurality of contacts 108 before the curing process for the second insulating material 116, for example. Prevention of the formation of the IMC 110 is beneficial because the interface integrity between the insulating material 116 and contacts 108 is maintained or improved. In some embodiments, an amount of IMC 110 that is formed on sidewalls of the contacts 108 is reduced because a eutectic material 120 has not been formed over the plurality of contacts 108 before the curing process for the second insulating material 116, as another example. Thus, reliability performance of the semiconductor device 100 is improved.

In some embodiments, the cure process of the second insulating material 116 is performed after the opening 118 formation. An opening 118 is formed in the second insulating material 116 over each of the plurality of contacts 108, as shown in the cross-sectional view illustrated in FIG. 3. The openings 118 are also referred to herein as second openings 118. The second openings 118 may be formed using photolithography, as described for the formation of first openings 105 shown in FIG. 1. The second openings 118 may also be formed using other methods.

Figure 3:
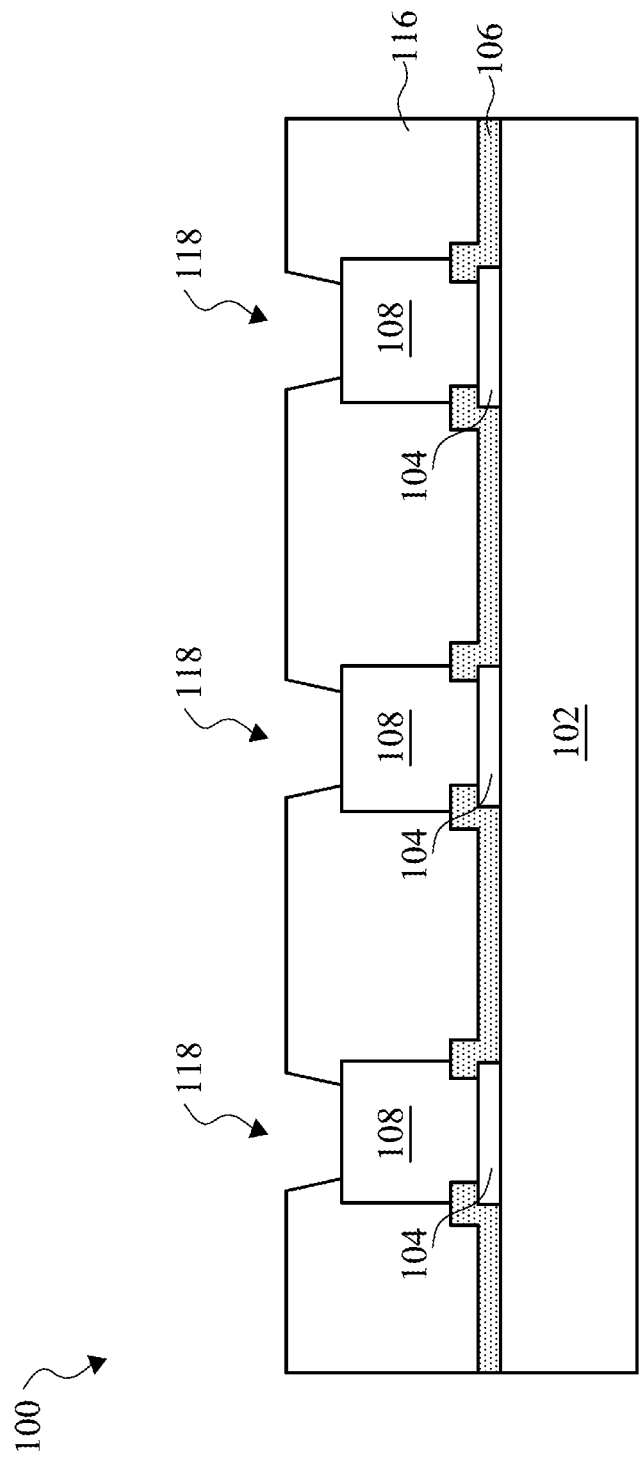

In some embodiments, each of the plurality of contacts 108 comprises a first width, and forming the second openings 118 in the second insulating material 116 comprises forming second openings 118 having a second width, the second width being less than the first width. After forming the second openings 118 in the second insulating material 116, a portion of the second insulating material 116 extends over edges of each of the plurality of contacts 108 in some embodiments, as illustrated in FIG. 3.

Figure 4:
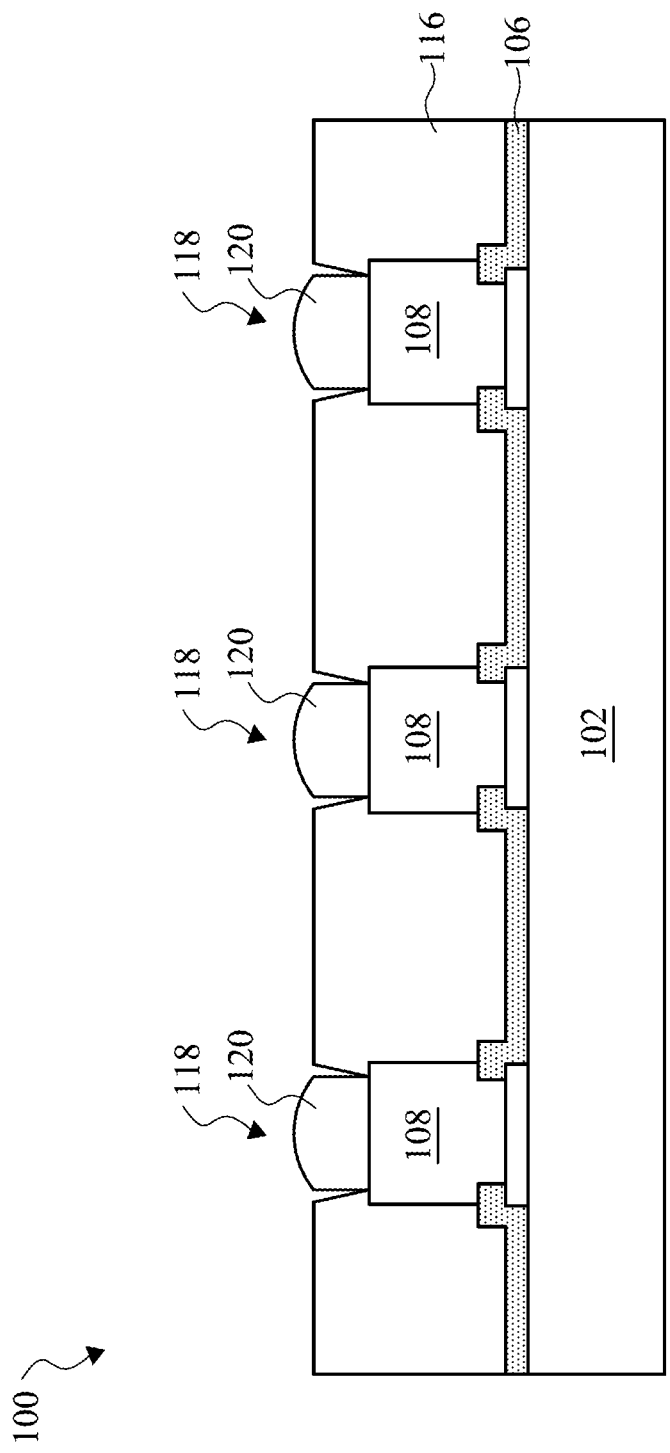

Referring next to FIG. 4, a eutectic material 120 is formed in the second openings 118 over each of the plurality of contacts 108. The eutectic material 120 may comprise a reflowable conductive material such as solder, for example, which provides improved contact with the probe needle 122 or a probe card 122' (see FIG. 5). The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials such as solder balls may be formed from SnCu compounds as well, without the use of silver (Ag). Lead-free solder materials may also include tin and silver, Sn—Ag, without the use of copper.

The eutectic material 120 may be formed in some embodiments using an electroless (E-Less) plating process, as shown in FIG. 4. The electroless plating process may comprise an electroless nickel/electroless palladium/immersion gold (ENEPIG) process, electroless nickel/electroless palladium (ENEP) process, immersion gold process, or other processes, as examples. Other electroless processes may also be used to form the eutectic material 120, for example.

Forming the eutectic material 120 after forming and curing the second insulating material 116 advantageously improves an adhesion between the sidewalls of the plurality of contacts 108 and the second insulating material 116 in some embodiments, due to preventing the formation of an IMC 110 or reduction in a thickness of an IMC 110 that is formed, for example.

Figure 5:
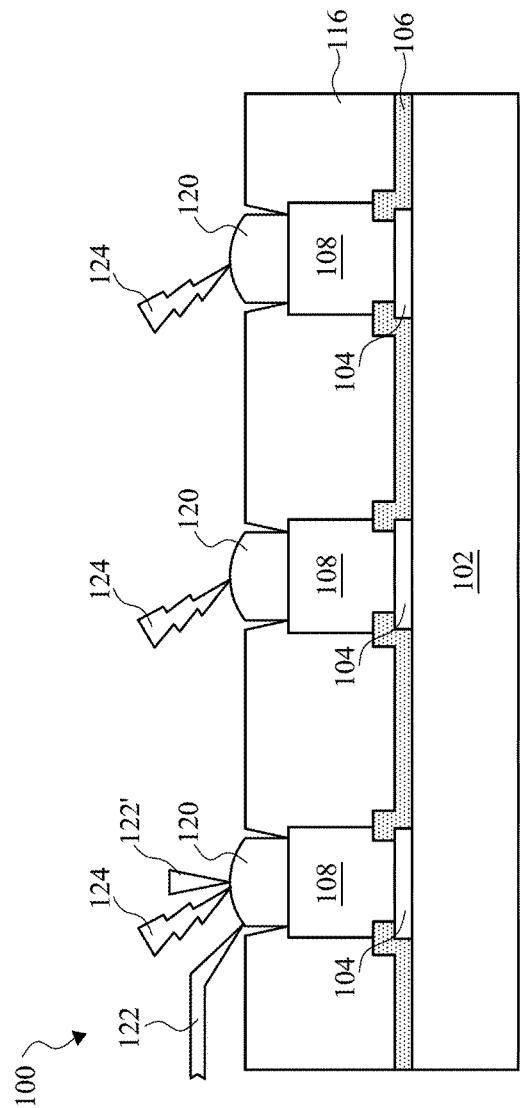

The integrated circuit die 102 is then electrically tested by contacting the eutectic material 120 disposed over each of the plurality of contacts 108, as shown in FIG. 5. The electrical testing 124 is performed by probing the eutectic material 120 disposed on each of the plurality of contacts 108. The plurality of contacts 108 may be probed using a probe needle 122 or a probe card 122', as examples. Other methods may also be used to electrically test the integrated circuit die 102 by contacting or probing the eutectic material 120. Including the eutectic material 120 over the plurality of contacts 108 may protect the plurality of contacts 108 from damage from the probing devices used during the electrical testing 124 in some embodiments. Including the eutectic material 120 over the plurality of contacts 108 may also improve the electrical connection with the plurality of contacts 108, for example. A chip probing (CP) procedure may be used to test the integrated circuit die 102 for a known good die (KGD) test in some embodiments, as an example. Other types of electrical testing 124 may also be performed on the integrated circuit die 102.

The eutectic material 120 improves electrical connections with the contacts 108 during the electrical testing process. In accordance with some embodiments, the eutectic material 120 is removed before singulation of the semiconductor devices 100 while a plurality of the semiconductor devices 100 are still in wafer form.

In some embodiments, the eutectic material 120 is left remaining during the singulation process, and the semiconductor devices 100 are pick-and-placed onto packaging elements. At a predetermined point in the packaging process, the eutectic material 120 is removed, and the packaging process is then continued for the semiconductor devices 100, which will be shown and described further herein (see FIGS. 12 through 23). For example, with the eutectic material 120 left remaining on the plurality of semiconductor devices 100, a plurality of the semiconductor devices 100 in wafer form are singulated and are partially packaged (FIGS. 12 through 16). The eutectic material 120 is then removed using a planarization process (FIG. 17). The packaging process is then continued to complete the packaging of the semiconductor devices 100 (FIGS. 18 through 23).

Figure 6:
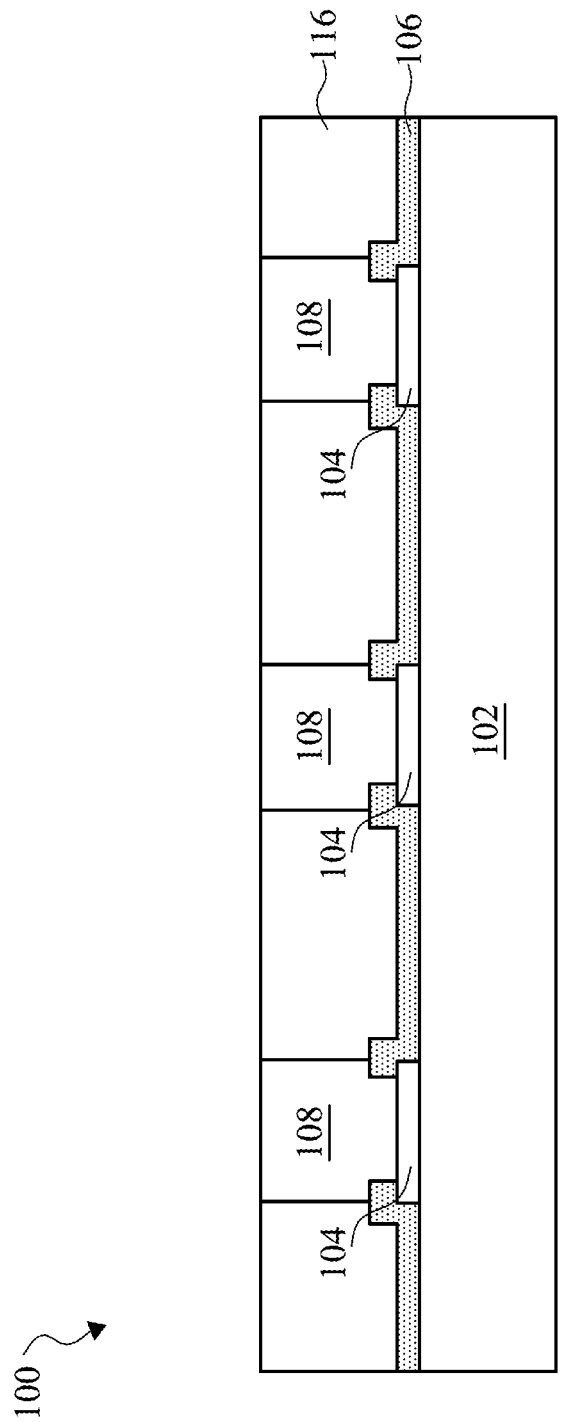
Figure 7:
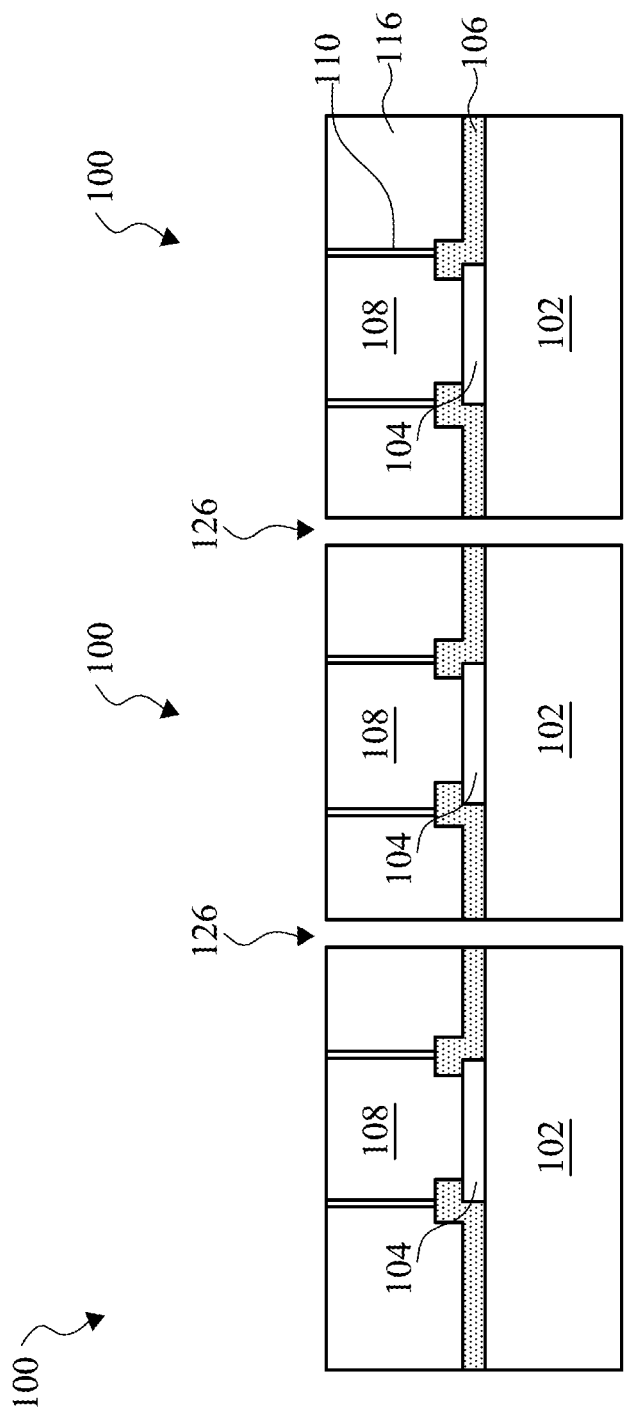

Some embodiments of the present disclosure wherein the eutectic material 120 is removed before singulation of the semiconductor devices 100 while a plurality of the semiconductor devices 100 are still in wafer form are illustrated in FIGS. 6 and 7. Referring next to FIG. 6, the eutectic material 120 may be removed after the electrical testing 124. The eutectic material 120 may be removed by thinning the semiconductor device 100, for example, as illustrated in the cross-sectional view shown in FIG. 6. The semiconductor device 100 may be thinned using a planarization process in some embodiments. The planarization process also removes a portion of the second insulating material 116 in some embodiments. A top portion of the plurality of contacts 108 may also be removed during the planarization process. The planarization process may comprise a chemical-mechanical polishing (CMP) process, a grinding process, an etch process, or a combination thereof, in some embodiments.

After thinning the semiconductor device 100 and removing the eutectic material 120, the integrated circuit dies 102 are singulated along scribe lines 126 disposed between the integrated circuit dies 102, as illustrated in FIG. 7. Note that some embodiments wherein an IMC 110 is formed on sidewalls of the contacts 108 adjacent the second insulating material 116 are illustrated in FIG. 7. In some embodiments, an IMC 110 is not formed on sidewalls of the contacts 108 (see FIG. 6). The integrated circuit dies 102 may then be packaged individually in a single package, together with other integrated circuit dies 102 in a single package, or used directly in an end application, as examples.

Figure 8:
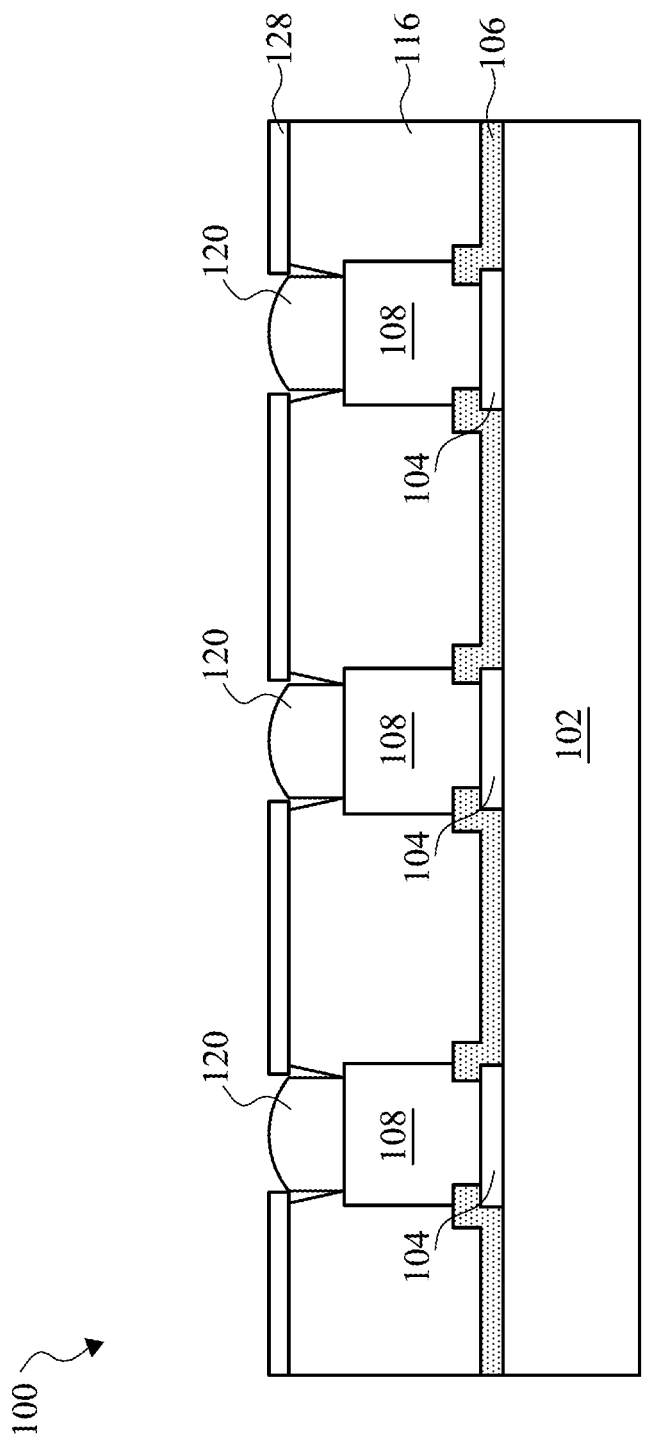
FIG. 8 is a cross-sectional view that illustrates a method of forming a eutectic material over contacts of a semiconductor device using a stencil in accordance with some embodiments.

The eutectic material 120 may also be formed using other methods than electroless plating processes. For example, FIG. 8 is a cross-sectional view that illustrates a method of forming the eutectic material 120 over the plurality of contacts 108 of a semiconductor device 100 using a stencil 128 in accordance with some embodiments. The stencil 128 may comprise a solder stencil that masks other portions of the semiconductor device 100 during the application of the eutectic material 120 on the plurality of contacts 108. The stencil 128 is disposed over the second insulating material 116, and the eutectic material 120 is applied or formed through patterns in the stencil 128 onto the plurality of contacts 108. The eutectic material 120 may be printed, brushed, sprayed, or dipped onto the plurality of contacts 108 or applied using other methods, for example. The stencil 128 is then removed, and the electrical testing 124 shown in FIG. 5, thinning of the semiconductor device 100 shown in FIG. 6 to remove the eutectic material 120, and singulation of the integrated circuit dies 102 shown in FIG. 7 are then performed. In some embodiments, with the eutectic material 120 left remaining on the plurality of semiconductor devices 100, a plurality of the semiconductor devices 100 in wafer form are singulated and are partially packaged. The eutectic material 120 is then removed using a planarization process. The packaging process is then continued to complete the packaging of the semiconductor devices 100.

Figure 9:
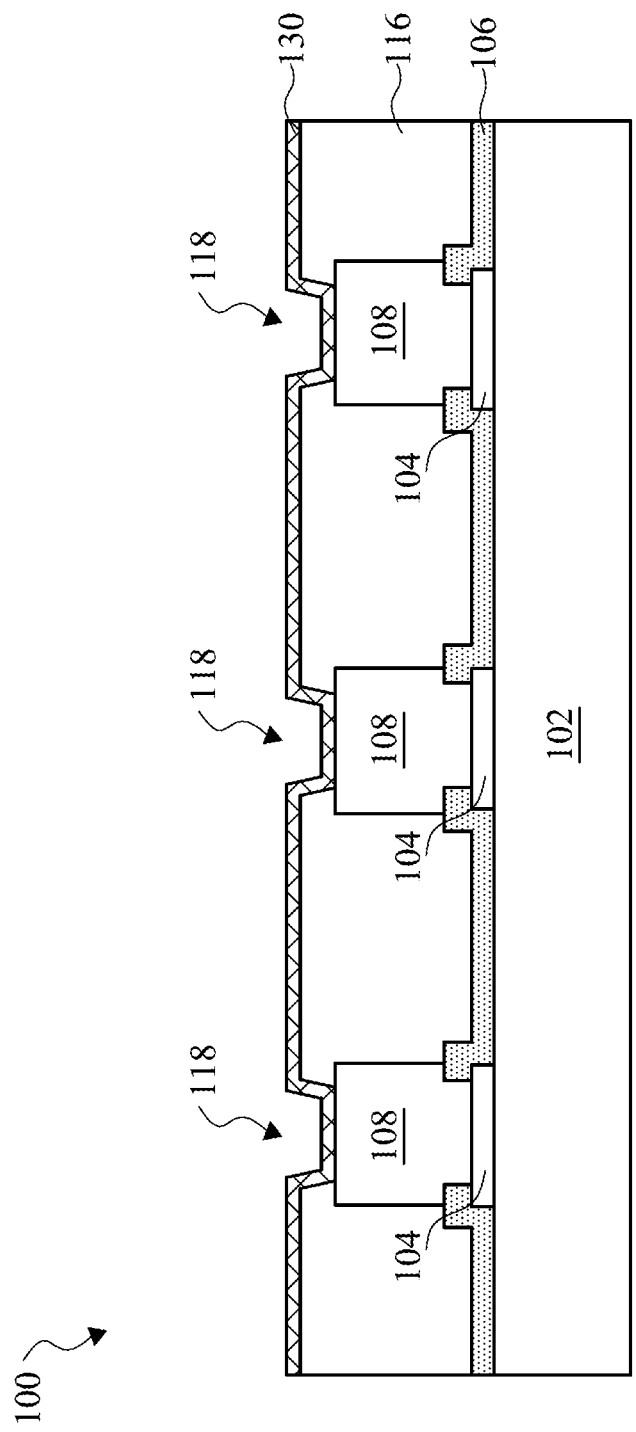
FIGS. 9 through 11 are cross-sectional views that show a method of forming a eutectic material over contacts of a semiconductor device using a seed layer and plating process in accordance with some embodiments.
Figure 10:
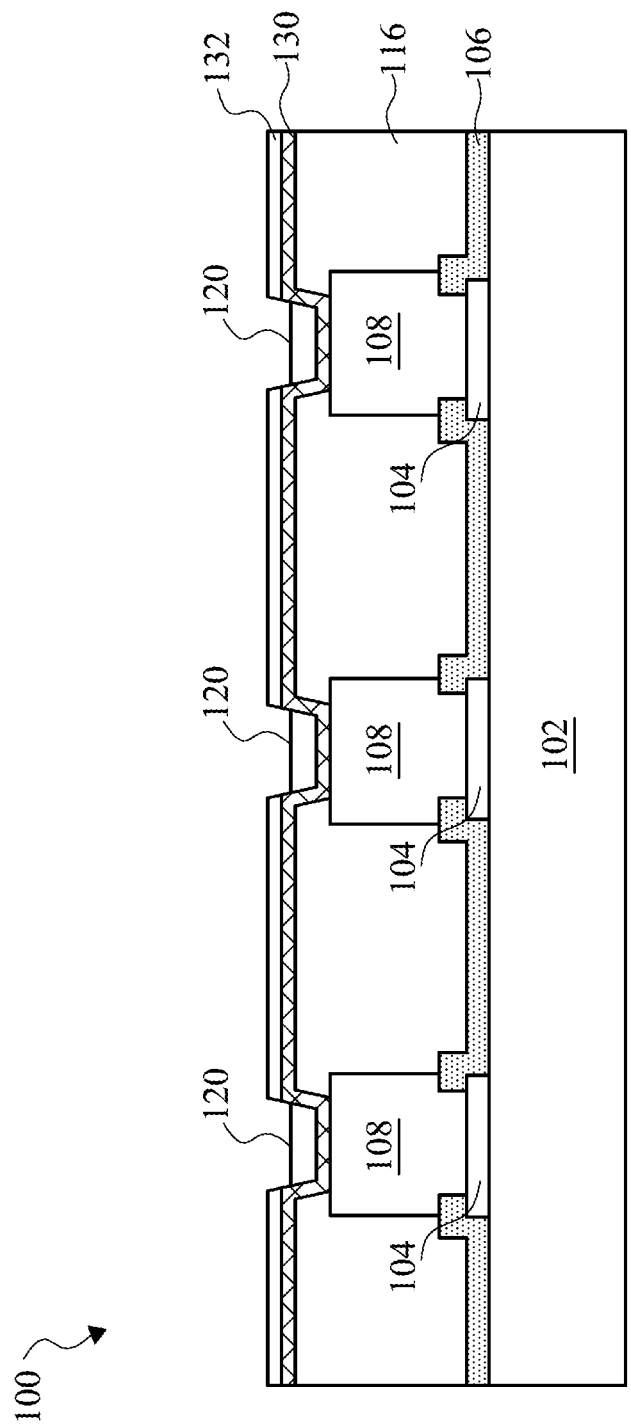
Figure 11:
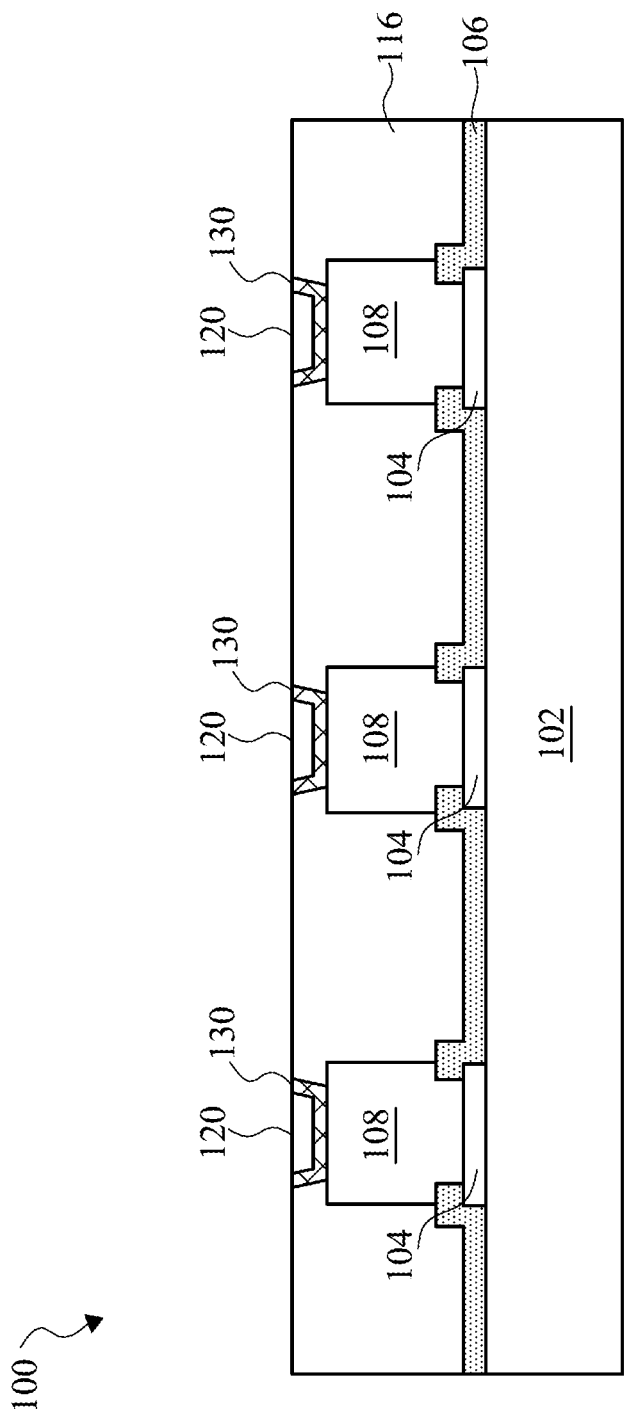

The eutectic material 120 may also be formed on the plurality of contacts 108 using an electro-plating process, as illustrated in FIGS. 9 through 11, which are cross-sectional views of a semiconductor device 100 that show a method of forming the eutectic material 120 over the plurality of contacts 108 of the semiconductor device 100 using a seed layer 130 and an electro-plating process at various stages in accordance with some embodiments. In FIG. 9, after the second insulating material 116 and second openings 118 are formed and cured as shown in FIG. 3, a seed layer 130 is formed over the second insulating material 116, the sidewalls of the second insulating material 116 within the openings 118, and the top surfaces of the plurality of contacts 108. The seed layer 130 comprises a material that is adapted to function as a seed layer for an electro-plating process of the eutectic material 120 (see FIG. 10). For example, in some embodiments, the seed layer 130 may comprise about 1,500 Angstroms to about 6,000 Angstroms of a metal, such as titanium, copper, nickel, or tungsten that is formed by a sputtering process, an E-Less plating process or a CVD process, as examples. The seed layer 130 may also comprise other materials, dimensions, and formation methods.

A layer of photoresist 132 is formed over the seed layer 130, as shown in FIG. 10. The layer of photoresist 132 is patterned using photolithography, removing the layer of photoresist 132 from over each of the plurality of contacts 108. The eutectic material 120 is then electro-plated on through the openings in the layer of photoresist 132, also shown in FIG. 10.

The layer of photoresist 132 is then removed, and exposed portions of the seed layer 130 are removed from over the top surface of the second insulating material 116, as shown in FIG. 11. The seed layer 130 may be removed using an etch process selective to the material of the seed layer 130, for example. The seed layer 130 may also be removed using a CMP process, grinding process, and/or an etch process, or other methods. The electrical testing 124 shown in FIG. 5, thinning of the semiconductor device 100 shown in FIG. 6 to remove the eutectic material 120, and singulation of the integrated circuit dies 102 shown in FIG. 7 are then performed. In some embodiments, with the eutectic material 120 left remaining on the plurality of semiconductor devices 100, a plurality of the semiconductor devices 100 in wafer form are singulated and are partially packaged. The eutectic material 120 is then removed using a planarization process. The packaging process is then continued to complete the packaging of the semiconductor devices 100.

Some embodiments of the present disclosure comprise methods of testing the semiconductor devices 100, and some embodiments comprise methods of manufacturing the semiconductor devices 100 that are illustrated in FIGS. 1 through 11.

Some embodiments of the present disclosure comprise methods of packaging the semiconductor devices 100. For example, FIGS. 12 through 23 are cross-sectional views that illustrate a method of packaging a semiconductor device 100 at various stages of a packaging process in accordance with some embodiments. The packaging process flow illustrates an integration fan-out (InFO) packaging process flow or a WLP packaging process flow in accordance with some embodiments. Other types of packaging process flows may also be used.

Figure 12:
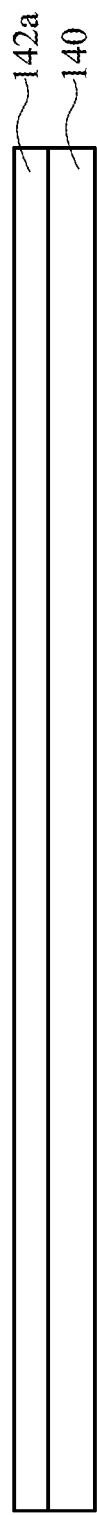
FIGS. 12 through 23 are cross-sectional views that illustrate a method of packaging a semiconductor device in accordance with some embodiments.
Figure 13:
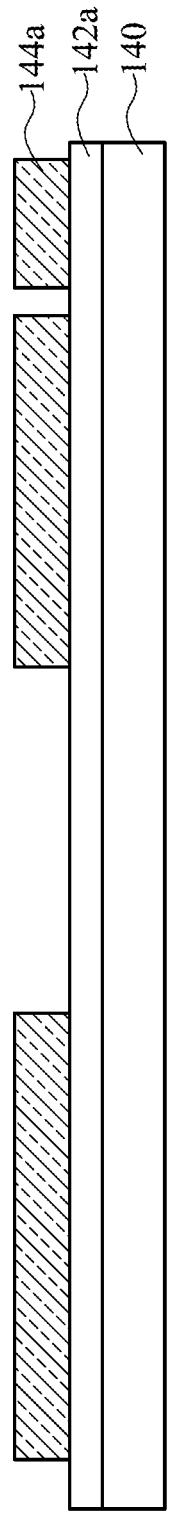

In FIG. 12, first, a carrier 140 is provided. A plurality of packaged semiconductor devices 160 (see FIGS. 22 and 23) is formed over the carrier 140, and the carrier 140 will later be removed after the connector 159 formation in some embodiments. The carrier 140 may comprise a glass carrier substrate, a ceramic carrier substrate, a wafer such as a semiconductor wafer, a tape, or the like. The carrier 140 may include a release layer (not shown) formed thereon which may comprise a polymer-based material. The release layer may be removed along with the carrier 140 from the overlying structures that will be formed in subsequent processing steps. In some embodiments, the release layer may comprise an epoxy-based thermal-release material, which loses its adhesive property when heated, such as a light-to-heat-conversion (LTHC) release coating. In other embodiments, the release layer may comprise an ultra-violet (UV) glue, which loses its adhesive property when exposed to UV light. The release layer may be dispensed as a liquid and cured, and may be a laminate film laminated onto the carrier 140, or the like.

An insulating material 142a is formed over the carrier 140, e.g., over the release layer on the carrier 140. The insulating material 142a may comprise similar materials, dimensions, and formation methods as described herein for the first insulating material 106, for example.

A redistribution layer (RDL) 150a is formed over the insulating material 142a, as shown in FIGS. 12 through 15. The first RDL 150a is also referred to herein as a first RDL 150a. The first RDL 150a may comprise a back side interconnect structure, for example. The first RDL 150a may comprise a PPI structure in some embodiments.

Figure 14:
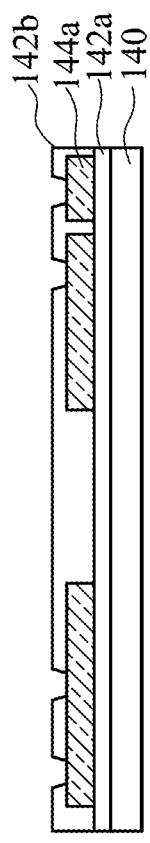

The first RDL 150a may be formed by forming one or more conductive line layers 144a that include insulating material layer or layers 142b disposed around conductive lines in the conductive line layers 144a. For example, in FIG. 13, a conductive line layer 144a of the first RDL 150a is formed over the insulating material 142a, and an insulating material layer 142b is formed over and around conductive lines in the conductive line layer 144a, as shown in FIG. 14. Openings may be formed in the insulating material layer 142b for vias in a via layer 146a (see FIG. 15) of the first RDL 150a. In some embodiments, a via layer 146a is not included in the first RDL 150a. In some embodiments, one or more via layers 146a may be included in the first RDL 150a. The first RDL 150a may include alternating layers of conductive line layers 144a and via layers 146a in some embodiments. The conductive line layer 144a or the conductive line layer 144a and via layer 146a comprise fan-out wiring and provide horizontal interconnections for the packaged semiconductor device 160 (see FIGS. 22 and 23) in some embodiments. The first RDL 150a may also comprise other types of interconnect structures.

Figure 15:
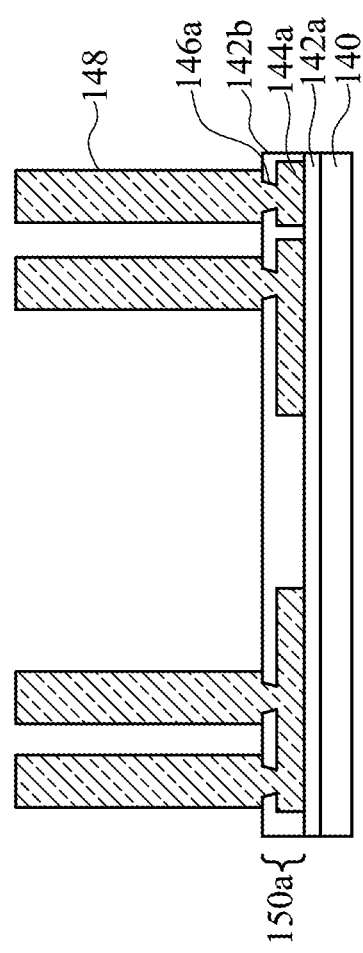

In FIG. 15, a plurality of through-vias 148 is formed over the first RDL 150a. Vias in the via layer 146a couple the plurality of through-vias 148 to portions of the conductive line layer 144a. The plurality of through-vias 148 provide vertical interconnections for the packaged semiconductor device 160 (see FIGS. 22 and 23) in some embodiments.

The material of the conductive lines on the conductive line layer 144a, the vias in the via layer 146a, and/or the plurality of through-vias 148 comprises a conductive material. The conductive material may comprise a metal, such as copper, titanium, tungsten, aluminum, alloys or multiple layers thereof, or the like. The conductive material may be formed by a plating process, such as electroplating or electroless plating, or the like. The conductive material may also be formed using subtractive etch techniques, by forming a conductive material over the carrier 140, and patterning the conductive material using a lithography process. Single or dual damascene methods may be used to form the conductive material of the conductive lines in the conductive line layer 144a, the vias in the via layer 146a, and/or the plurality of through-vias 148, as another example. The conductive lines in the conductive line layer 144a, the vias in the via layer 146a, and/or the plurality of through-vias 148 may also comprise other materials and be formed using other methods.

The insulating material layer or layers 142b shown in FIGS. 14 and 15 of the first RDL 150a are formed around the conductive lines in the conductive line layer 144a and vias in the via layer 146a. The insulating material layer(s) 142b may comprise a polymer, such as PBO, polyimide, BCB, or the like. In some embodiments, the insulating material layer(s) 142b may comprise a nitride such as silicon nitride; an oxide such as silicon oxide, PSG, borosilicate glass (BSG), BPSG; combinations or multiple layers thereof; or the like. The insulating material layer(s) 142b may be formed by any acceptable deposition process, such as spin coating, CVD, laminating, the like, or a combination thereof.

Figure 16:
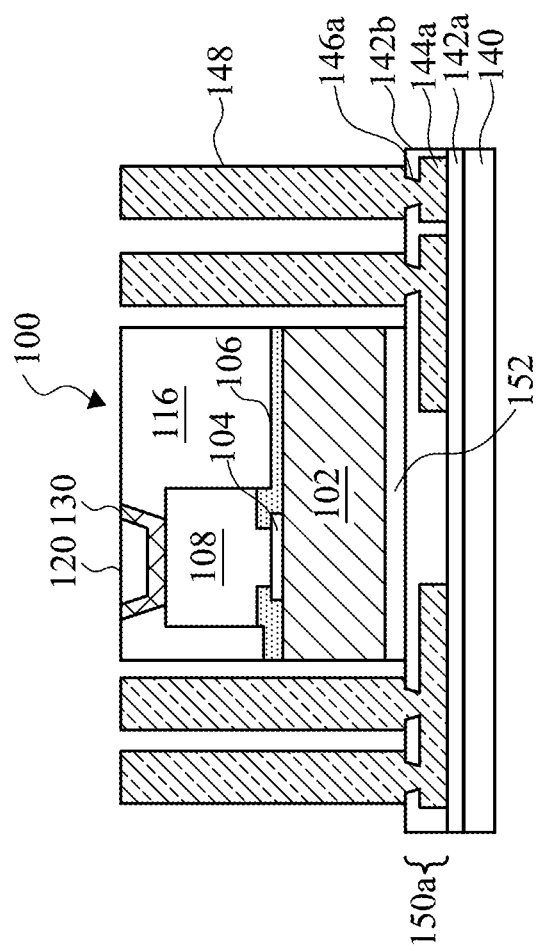
Figure 17:
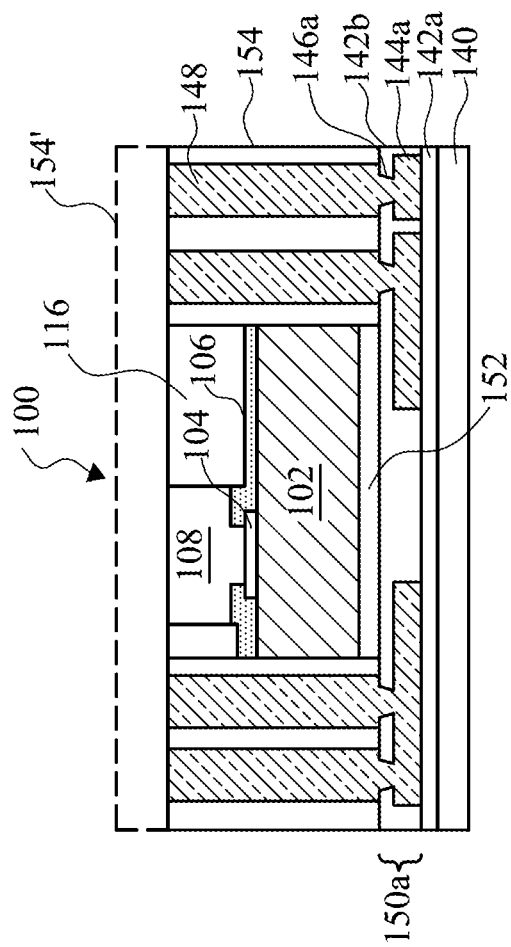
Figure 18:
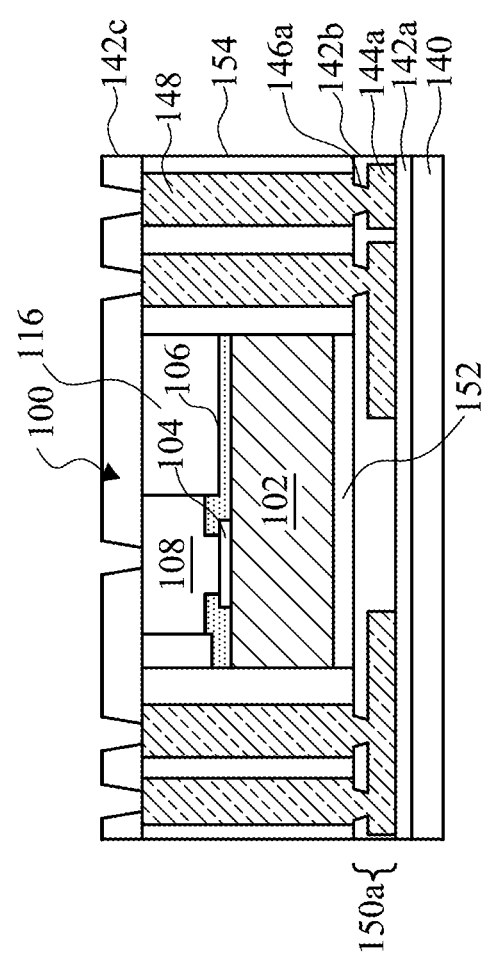

Referring next to FIG. 16, after electrically testing 124 a plurality of integrated circuit dies 102 that are in wafer form (e.g., on the substrate 101 shown in FIG. 1) by probing the eutectic material 120 disposed over each of the plurality of contacts 108 that comprise conductive pillars as shown in FIG. 5, the plurality of integrated circuit dies 102 are singulated, and the plurality of integrated circuit dies 102 that passed the electrical testing 124 are packaged. For example, in FIG. 16, a semiconductor device 100 that includes an integrated circuit die 102 that passed the electrical testing 124 is coupled to the first RDL 150a. The semiconductor device 100 may be coupled to the first RDL 150a using a DAF 152 or other type of adhesive, manually or using a pick-and-place machine. The semiconductor device 100 may be coupled between a plurality of the through-vias 148 in some embodiments. The semiconductor device 100 may also be coupled to the first RDL 150a in other locations, such as in an edge or corner of the first RDL 150a, not shown. One or more semiconductor devices 100 may be coupled to the first RDL 150a within a single packaged semiconductor device 160 (see FIGS. 22 and 23) in accordance with some embodiments. A plurality of semiconductor devices 100 are packaged simultaneously over the carrier 140 and are then singulated into packaged semiconductor devices 160 in some embodiments.

Note that in some of the embodiments illustrated in FIG. 16, the eutectic material 120 has not been removed from the semiconductor device(s) 100. The plurality of integrated circuit dies 102 may be singulated prior to the removal of the eutectic material 120 in some embodiments. In some embodiments, the eutectic material 120 may be removed from the semiconductor device(s) 100 while still in wafer form, as illustrated in FIG. 6. The semiconductor device(s) 100 may also be coupled to the first RDL 150a after the eutectic material 120 has been removed. The eutectic material 120 may be removed from a plurality of the integrated circuit dies 102 before singulating the plurality of integrated circuit dies 102, or after singulating the plurality of integrated circuit dies 102.

In FIG. 17, a molding material 154 is disposed over and around the plurality of through-vias 148 and the semiconductor device(s) 100. The molding material 154 encapsulates the plurality of through-vias 148 and the semiconductor device(s) 100 in some embodiments, for example. The molding material 154 may comprise a molding compound comprised of an insulating material, such as an epoxy, a filler material, a stress release agent (SRA), an adhesion promoter, other materials, or combinations thereof, as examples. The molding material 154 may comprise a liquid or gel when applied so that it flows between and around the plurality of through-vias 148 and the semiconductor device(s) 100, in some embodiments. The molding material 154 is then cured or allowed to dry so that it forms a solid. A molding compound clamp may be applied during a curing process and a plasma treatment process of the molding material 154 in some embodiments. In some embodiments, as deposited, the molding material 154 extends over top surfaces of the plurality of through-vias 148 and the semiconductor device(s) 100, as illustrated in phantom (e.g., in dashed lines) in FIG. 17 at 154'. Other methods may also be used to form the molding material 154.

After the molding material 154 is applied, a top portion of the molding material 154 is removed using a planarization process, such as a CMP process, a grinding process, an etch process, or combinations thereof in some embodiments, as examples. Other methods may also be used to planarize the molding material 154. A top portion of the plurality of through-vias 148 and/or the semiconductor device(s) 100 may also be removed during the planarization process for the molding material 154. In embodiments wherein the eutectic material 120 resides on the semiconductor device(s) 100, the eutectic material 120 is removed during the planarization process for the molding material 154 in accordance with some embodiments. For example, removing the eutectic material 120 of the semiconductor device(s) 100 may comprise planarizing the plurality of integrated circuit dies 102 that passed the electrical testing 124, after forming the molding material 154. In some embodiments wherein a seed layer 130 is used to form the eutectic material 120, a portion of the seed layer 130 may be left remaining over the plurality of contacts 108, or the seed layer 130 may be removed in the planarization process.

In some embodiments, an amount of the molding material 154 applied may be controlled so that top surfaces of the plurality of through-vias 148 and semiconductor device(s) 100 are exposed, so that a planarization process for the molding material 154 is not required. For example, in some embodiments wherein the semiconductor device(s) 100 have had the eutectic material 120 removed before coupling the semiconductor device(s) to the first RDL 150a, as shown in FIG. 6, a planarization process to remove the eutectic material 120 may not be required.

Next, a second RDL 150b comprising an interconnect structure is formed over the molding material 154, the semiconductor device(s) 100, and the plurality of through-vias 148, as shown in FIGS. 18 through 22. The second RDL 150*b* may comprise a front side interconnect structure, for example. The second RDL 150*b* may comprise a PPI structure in some embodiments.

One or more conductive material layers and insulating material layers of the second RDL 150*b* are sequentially formed over the molding material 154, the semiconductor device(s) 100, and the plurality of through-vias 148 in some embodiments. For example, the second RDL 150*b* may be formed over the planarized molding material 154, the plurality of through-vias 148, and the semiconductor device(s) 100, as shown in FIGS. 18 through 22. The second RDL 150*b* may comprise one or more conductive line layers and one or more via layers.

Conductive line and via layers 156*a* and 156*b* of the second RDL 150*b* may comprise similar materials and formation methods as described for conductive line layers 144*a* and via layers 146*a* of the first RDL 150*a* in some embodiments. The conductive line and via layers 156*a* and 156*b* of the second RDL 150*b* comprise fan-out wiring and provide horizontal interconnections for the packaged semiconductor device 160 (see FIGS. 22 and 23) in some embodiments. The second RDL 150*b* may also comprise other types of interconnect structures. Likewise, insulating materials 142*c*, 142*d*, and 142*e* may comprise similar materials and formation methods as described for insulating material layer(s) 142*b* of the first RDL 150*a*.

Figure 19:
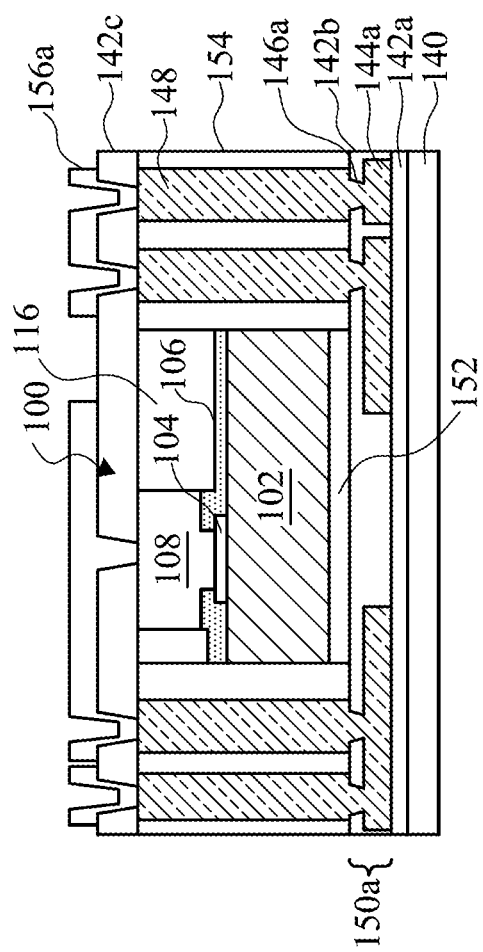

In some embodiments, conductive lines and vias may be simultaneously formed in the conductive line and via layers 156*a* and 156*b*, using a dual damascene process, plating process, or other methods. For example, in FIG. 18, an insulating material layer 142*c* is formed over the molding material 154, the semiconductor device(s) 100, and the plurality of through-vias 148. The insulating material layer 142*c* is patterned with a pattern for a plurality of vias, and a conductive material is formed over the patterned insulating material layer 142*c*, as shown in FIG. 19. The conductive material may be plated on through a patterned sacrificial material, not shown, forming conductive lines over the surface of the insulating material layer 142*c* and forming vias within the openings in the insulating material layer 142*c*. Conductive lines and vias in the conductive line and via layer 156*a* may also be formed using other methods, such as a subtractive etch process.

Figure 20:
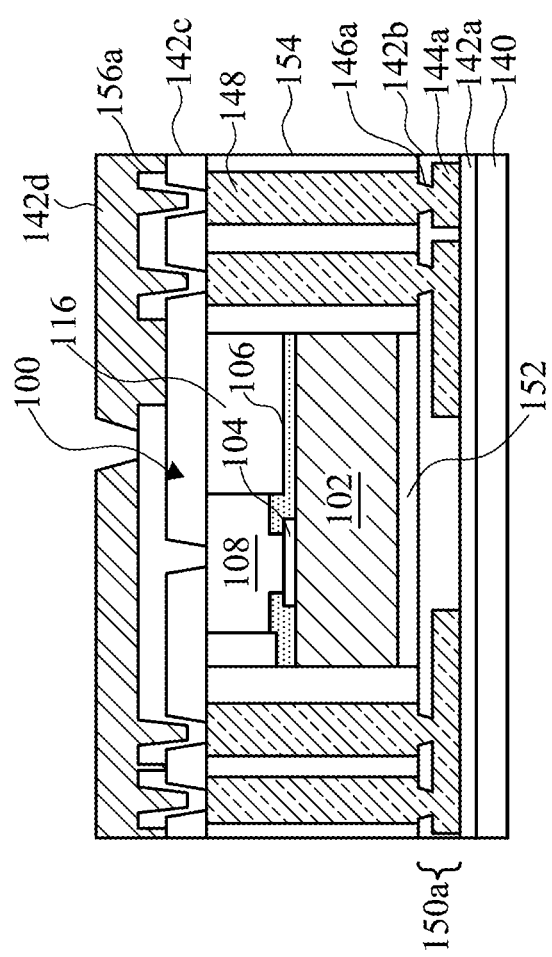
Figure 21:
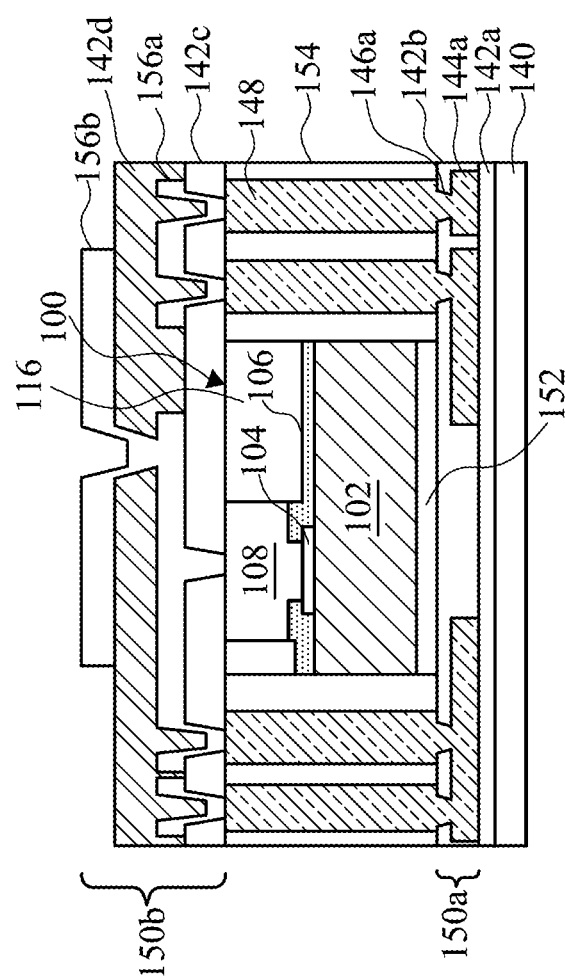
Figure 22:
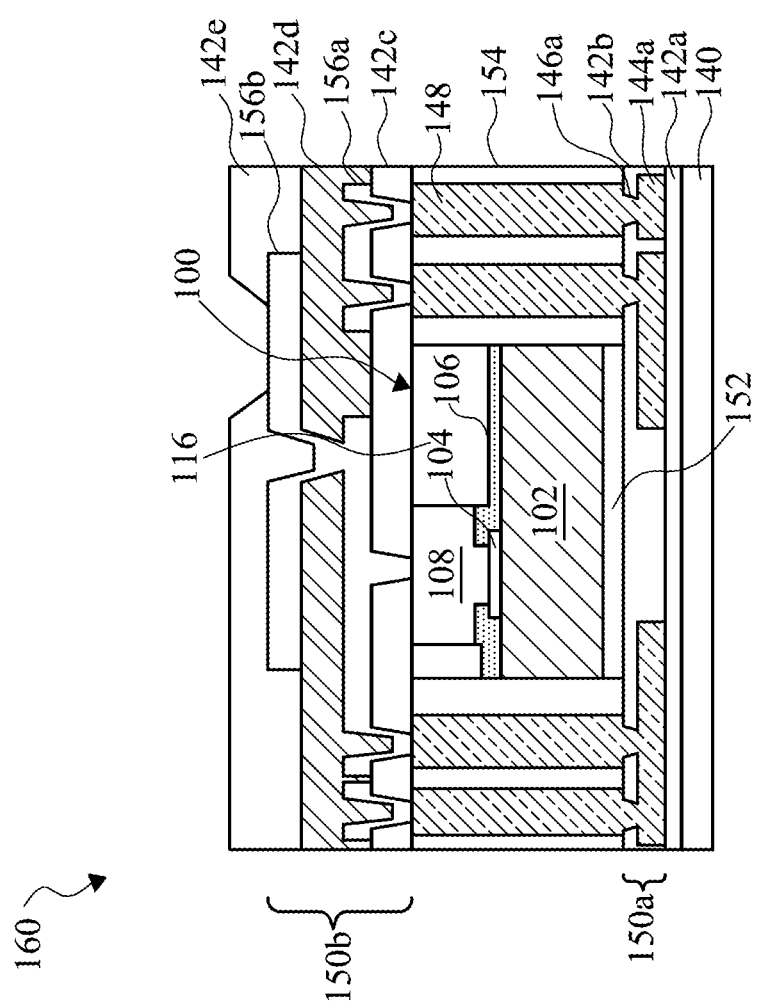

An insulating material layer 142*d* is formed over the conductive line and via layer 156*a*, as shown in FIG. 20, and the insulating material layer 142*d* is patterned. A similar method as described for the conductive line and via layer 156*a* may be used to form conductive lines and vias in the conductive line and via layer 156*b*, shown in FIG. 21. An insulating material layer 142*e* may be formed over the conductive line and via layer 156*b*, as shown in FIG. 22, and openings may be formed in insulating material layer 142*e* over portions of conductive lines in conductive line and via layer 156*b* so that electrical connections may be made to portions of conductive features in conductive line and via layer 156*b*. Only one opening is shown in FIG. 22; a plurality of openings are formed over the packaged semiconductor devices 160 in some embodiments. The second RDL 150*b* comprises conductive line and via layers 156*a* and 156*b*, insulating material layers 142*c* and 142*d*, and a portion of insulating material layer 142*e*.

Figure 23:
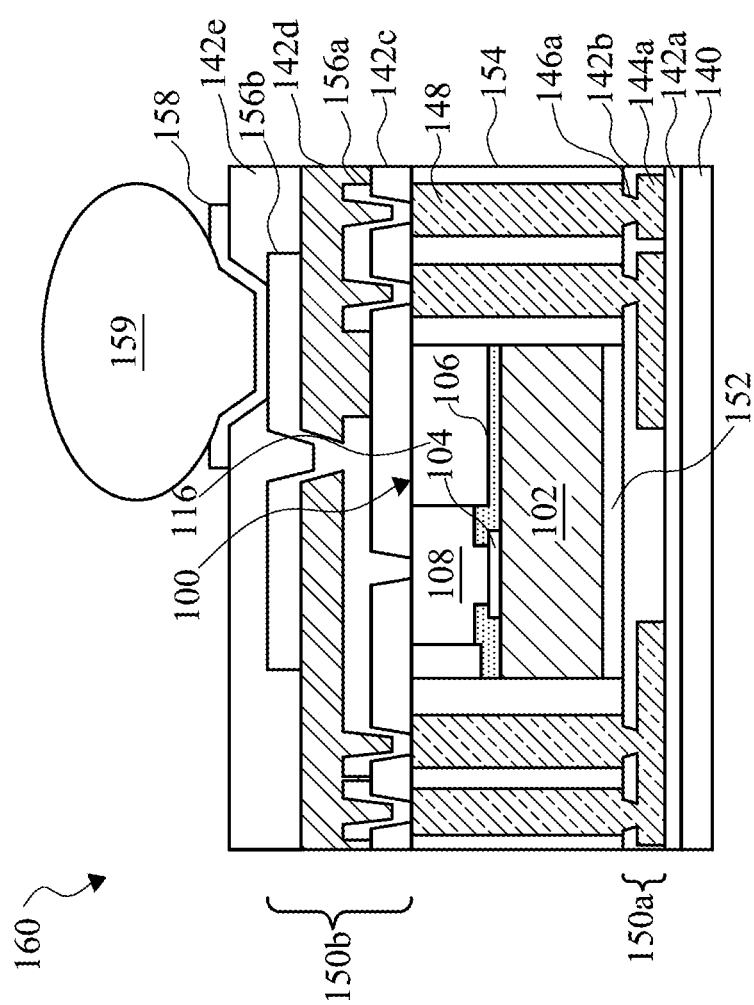

FIG. 23 illustrates some embodiments wherein an underball metallization (UBM) structure 158 is formed within and over an upper insulating material layer 142*e* over the second RDL 150*b*. The UBM structure 158 includes a conductive material layer that extends within openings formed in insulating material layer 142*e* over portions of conductive lines in conductive line and via layer 156*b*. The UBM structure 158 may comprise similar materials and formation methods as described for conductive line layers 144*a* and via layers 146*a* of the first RDL 150*a* in some embodiments. The UBM structure 158 comprises mounting regions for connectors 159, for example.

Connectors 159 are coupleable to the UBM structure 158, also shown in FIG. 23. The connectors 159 may comprise solder bumps, solder balls, or other types of connectors 159. The connectors 159 may be formed using a ball mount process or other process, for example. The connectors 159 may comprise a eutectic material, and may comprise similar materials as described for eutectic material 120, for example. Only one connector 159 is shown in FIG. 23: a plurality of connectors 159 is formed over the packaged semiconductor devices 160 in some embodiments. The connectors 159 may be arranged in rows and columns on the packaged semiconductor devices 160 or in predetermined locations on the packaged semiconductor devices 160, such as along the edges or perimeter. In some embodiments, the connectors 159 are not included. For example, connectors on another device (not shown) or another packaged semiconductor device may be used to connect to the second RDL 150*b* in some embodiments.

After the formation of the second RDL 150*b* or after attachment of the connectors 159 to the second RDL 150*b*, the carrier 140 is removed, and a plurality of the packaged semiconductor devices 160 are singulated (not shown).

Figure 24:
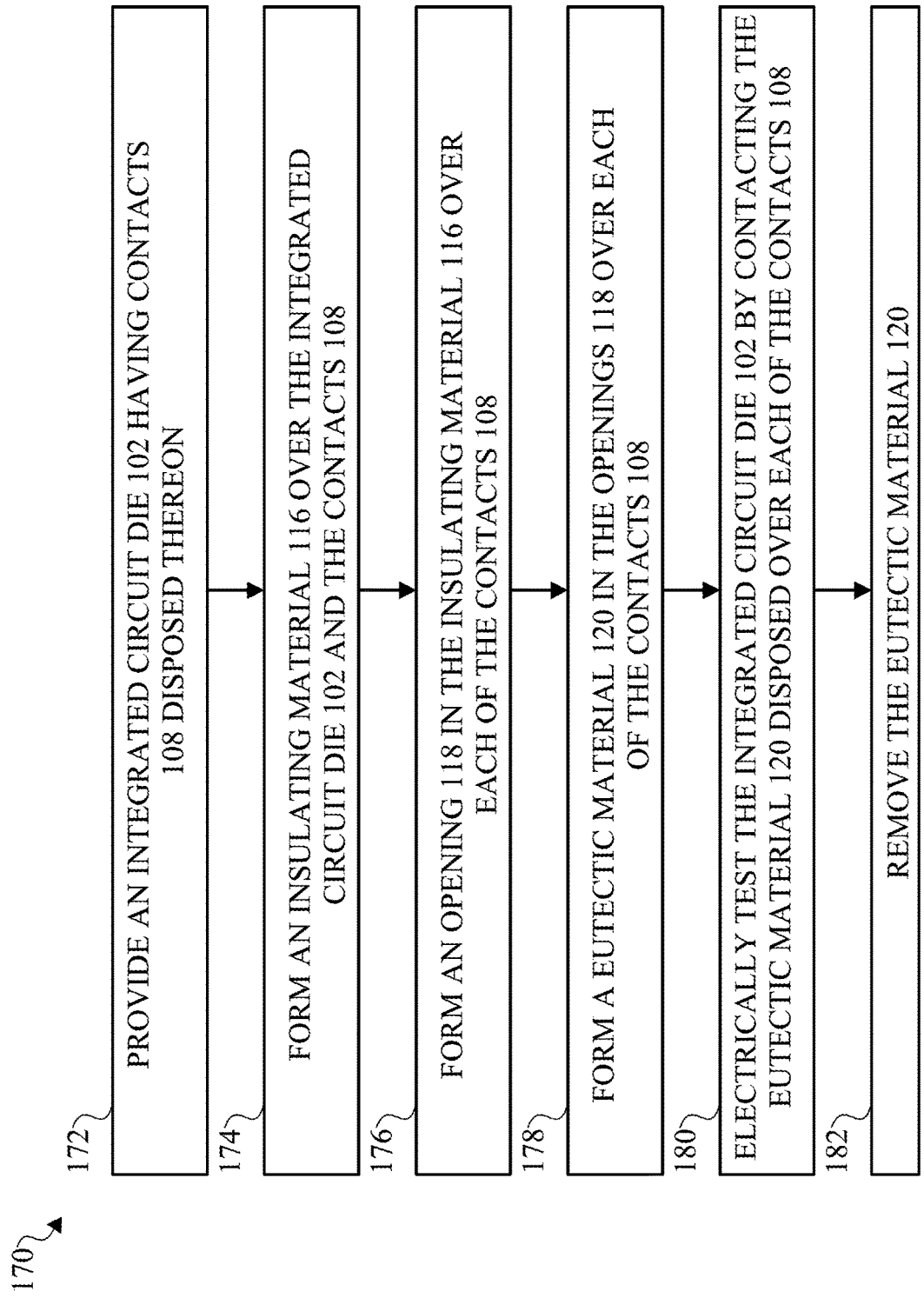
FIG. 24 is a flow chart that illustrates a method of testing a semiconductor device in accordance with some embodiments of the present disclosure.

FIG. 24 is a flow chart 170 that illustrates a method of testing a semiconductor device 100 in accordance with some embodiments of the present disclosure. In step 172, an integrated circuit die 102 is provided that includes contacts 108 disposed thereon (see also FIG. 1). In step 174, an insulating material 116 is formed over the integrated circuit die 102 and the contacts 108 (see also FIG. 2). In step 176, an opening 118 is formed in the insulating material 116 over each of the contacts 108 (see also FIG. 3). In step 178, a eutectic material 120 is formed in the openings 118 over each of the contacts 108 (see also FIGS. 4, 8, and 10). In step 180, the integrated circuit die 102 is electrically tested by contacting the eutectic material 120 disposed over each of the contacts 108 (see also FIG. 5). In step 182, the eutectic material 120 is removed (see also FIG. 6).

Some embodiments of the present disclosure include testing, manufacturing, and packaging methods for semiconductor devices, wherein a eutectic material is formed over contacts of integrated circuit dies after an insulating material is formed around and over the contacts and openings in the insulating material are formed over the contacts. The integrated circuit dies are electrically tested by contacting or probing the eutectic material, and the eutectic material may be removed. The integrated circuit dies that passed the electrical tests are then packaged. The integrated circuit dies may be packaged using InFO or WLP techniques in some embodiments.

Some advantages of some embodiments of the present disclosure include providing integrated circuit dies with improved reliability and enlarged reliability windows, by forming the eutectic material over contacts of the integrated circuit dies after forming the insulating material and forming openings over the contacts. The eutectic material disposed over the contacts improves electrical connection to probe cards or probe needles used to test the integrated circuit dies, and may reduce or prevent measurement noise. Forming the eutectic material after forming and curing the second insulating material advantageously may prevent the formation of an IMC and improve an adhesion between sidewalls of the contacts and the second insulating material, reducing or preventing delamination defects that may be caused by the presence of an IMC. In some embodiments, an amount of an IMC formed between sidewalls of contacts and the second insulating material is advantageously reduced. The eutectic material may be removed before or after singulating the integrated circuit dies. Furthermore, the testing, manufacturing, and packaging methods described herein are easily implementable into existing semiconductor device testing, manufacturing, and packaging process flows and structures.

In some embodiments, a method of testing a semiconductor device includes providing an integrated circuit die having a plurality of contacts disposed thereon, forming an insulating material over the integrated circuit die and the plurality of contacts, and forming an opening in the insulating material over each of the plurality of contacts. A eutectic material is formed in the openings over each of the plurality of contacts, and the integrated circuit die is electrically tested by contacting the eutectic material disposed over each of the plurality of contacts. The eutectic material is removed.

In some embodiments, a method of manufacturing a semiconductor device includes providing an integrated circuit die comprising a plurality of contact pads disposed thereon, forming a first insulating material over the integrated circuit die and the plurality of contact pads, and forming a first opening in the first insulating material over each of the plurality of contact pads. The method includes forming a conductive pillar over each of the plurality of contact pads through the first openings, forming a second insulating material over the conductive pillars and the first insulating material, and forming a second opening in the second insulating material over each of the conductive pillars. The method also includes forming a eutectic material in the second openings over each of the conductive pillars, electrically testing the integrated circuit die by probing the eutectic material disposed over each of the conductive pillars, and removing the eutectic material.

In some embodiments, a method of packaging a semiconductor device includes providing a wafer comprising a plurality of integrated circuit dies disposed thereon, each of the plurality of integrated circuit dies comprising a plurality of conductive pillars disposed thereon, and forming an insulating material over the wafer. An opening is formed in the insulating material over each of the plurality of conductive pillars of the plurality of integrated circuit dies. A eutectic material is formed in the openings over each of the plurality of conductive pillars of the plurality of integrated circuit dies. The plurality of integrated circuit dies is electrically tested by probing the eutectic material disposed over each of the plurality of conductive pillars. The method includes removing the eutectic material, singulating the plurality of integrated circuit dies, and packaging the plurality of integrated circuit dies that passed the electrical testing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of testing a semiconductor device, the method comprising:
   providing an integrated circuit die comprising a plurality of contacts disposed thereon, wherein each of the plurality of contacts comprises a first width;
   forming an insulating material over the integrated circuit die and the plurality of contacts;
   forming an opening in the insulating material over each of the plurality of contacts, wherein forming the openings in the insulating material comprises forming the openings having a second width, the second width being less than the first width;
   forming a eutectic material in the openings over each of the plurality of contacts;
   electrically testing the integrated circuit die by contacting the eutectic material disposed over each of the plurality of contacts; and
   removing the eutectic material.

2. The method according to claim 1, wherein each of the plurality of contacts comprises a conductive pillar.

3. The method according to claim 1, wherein removing the eutectic material comprises planarizing the integrated circuit die.

4. The method according to claim 1, wherein after forming the openings in the insulating material, a portion of the insulating material extends over edges of each of the plurality of contacts.

5. The method according to claim 1, wherein forming the eutectic material comprises disposing a stencil over the insulating material, and forming the eutectic material through patterns in the stencil.

6. The method according to claim 1, wherein forming the eutectic material comprises an electroless plating process or an electro-plating process.

7. A method of manufacturing a semiconductor device, the method comprising:
   providing an integrated circuit die comprising a plurality of contact pads disposed thereon;
   forming a first insulating material over the integrated circuit die and the plurality of contact pads;
   forming a first opening in the first insulating material over each of the plurality of contact pads;
   forming a conductive pillar over each of the plurality of contact pads through the first openings;
   forming a second insulating material over the conductive pillars and the first insulating material;
   forming a second opening in the second insulating material over each of the conductive pillars;
   forming a eutectic material in the second openings over each of the conductive pillars;
   electrically testing the integrated circuit die by probing the eutectic material disposed over each of the conductive pillars; and
   removing the eutectic material.

8. The method according to claim 7, wherein removing the eutectic material comprises a planarization process.

9. The method according to claim 8, wherein removing the eutectic material further comprises removing a portion of the second insulating material.

10. The method according to claim 8, wherein the planarization process comprises a chemical-mechanical polishing (CMP) process, a grinding process, an etch process, or a combination thereof.

11. The method according to claim 7, wherein electrically testing the integrated circuit die comprises using a known good die (KGD) testing process.

12. The method according to claim 7, wherein the conductive pillars comprise copper or a copper alloy.

13. The method according to claim 7, further comprising curing the second insulating material after forming the second insulating material and forming the eutectic material after curing the second insulating material, wherein a formation of an inter-metallic compound (IMC) on sidewalls of the conductive pillars during the curing of the second insulating material is reduced or prevented by forming the eutectic material after curing the second insulating material.

14. A method of packaging a semiconductor device, the method comprising:
   providing a wafer comprising a plurality of integrated circuit dies disposed thereon, each of the plurality of integrated circuit dies comprising a plurality of conductive pillars disposed thereon;
   forming an insulating material over the wafer;
   forming an opening in the insulating material over each of the plurality of conductive pillars of the plurality of integrated circuit dies;
   forming a eutectic material in the openings over each of the plurality of conductive pillars of the plurality of integrated circuit dies, a width of a portion of the eutectic material over a first conductive pillar of the plurality of conductive pillars being less than a width of the first conductive pillar of the plurality of conductive pillars;
   electrically testing the plurality of integrated circuit dies by probing the eutectic material disposed over each of the plurality of conductive pillars;
   removing the eutectic material;
   singulating the plurality of integrated circuit dies; and
   packaging the plurality of integrated circuit dies that passed the electrical testing.

15. The method according to claim 14, wherein removing the eutectic material comprises planarizing the plurality of integrated circuit dies before singulating the plurality of integrated circuit dies.

16. The method according to claim 14, wherein packaging the plurality of integrated circuit dies that passed the electrical testing comprises:
   forming a redistribution layer (RDL) over a carrier;
   forming a plurality of through-vias over the RDL;
   coupling one of the plurality of integrated circuit dies that passed the electrical testing to the RDL; and
   forming a molding material around the plurality of through-vias and the one of the plurality of integrated circuit dies that passed the electrical testing and over the RDL.

17. The method according to claim 16, wherein removing the eutectic material comprises planarizing the plurality of integrated circuit dies that passed the electrical testing, after forming the molding material.

18. The method according to claim 16, wherein forming the RDL comprises forming a first RDL, and wherein the method further comprises:
   forming a second RDL over the one of the plurality of integrated circuit dies that passed the electrical testing, the plurality of through-vias, and the molding material;
   coupling a plurality of connectors to the second RDL; and
   removing the carrier.

19. The method according to claim 18, wherein the first RDL or the second RDL comprises fan-out wiring.

20. The method according to claim 18, wherein the first RDL or the second RDL comprises one or more conductive line layers and one or more via layers.

* * * * *